United States Patent
Araki et al.

(10) Patent No.: US 7,170,186 B2
(45) Date of Patent: Jan. 30, 2007

(54) LAMINATED RADIATION MEMBER, POWER SEMICONDUCTOR APPARATUS, AND METHOD FOR PRODUCING THE SAME

(75) Inventors: Kiyoshi Araki, Ann Arbor, MI (US); Masahiro Kida, Nagoya (JP); Takahiro Ishikawa, Nagoya (JP); Yuki Bessyo, Nishikasugai-gun (JP); Takuma Makino, Kasugai (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/179,216

(22) Filed: Jul. 12, 2005

(65) Prior Publication Data

US 2005/0263877 A1    Dec. 1, 2005

Related U.S. Application Data

(60) Continuation of application No. 10/242,862, filed on Sep. 13, 2002, now abandoned, which is a division of application No. 09/774,206, filed on Jan. 30, 2001, now Pat. No. 6,485,816.

(30) Foreign Application Priority Data

Jan. 31, 2000    (JP)    .............................. 2000-023422

(51) Int. Cl.
*H01L 23/00* (2006.01)

(52) U.S. Cl. ...................... 257/783; 257/702; 257/703; 257/E23.04

(58) Field of Classification Search ................ 257/702, 257/703, 783, E23.04
See application file for complete search history.

(56) References Cited

U.S. PATENT DOCUMENTS 4,756,754 A    7/1988    SinghDeo (Continued)

FOREIGN PATENT DOCUMENTS

EP    0 422 558 A2    4/1991

(Continued)

OTHER PUBLICATIONS

"Material," vol. 36, No. 1, 1997, pp. 40-46.

*Primary Examiner*—Eugene Lee
(74) *Attorney, Agent, or Firm*—Burr & Brown

(57) ABSTRACT

A laminated radiation member includes a radiation plate, an insulation substrate bonded to the upper surface of the radiation plate and an electrode provided on the upper surface of the insulation substrate. The laminated radiation member is made by a method including the steps of surface treating a bonding surface of the radiation plate and/or the insulation substrate, interposing ceramic particles surface treated to assure wettability with a hard solder or a metal between the radiation plate and the insulation substrate, disposing a hard solder above and/or below the ceramic particles, heating the hard solder to a temperature higher than the melting point of the solder, penetrating the molten hard solder into spaces between the ceramic particles to react the ceramic particles with the solder to produce a metal base composite material, and bonding the radiation plate and the insulation substrate with the metal base composite material.

2 Claims, 2 Drawing Sheets

U.S. PATENT DOCUMENTS

| | | | |
|---|---|---|---|
| 4,770,953 | A | 9/1988 | Horiguchi et al. |
| 5,328,751 | A | 7/1994 | Komorita et al. |
| 5,354,415 | A | 10/1994 | Fushii et al. |
| 5,529,852 | A | 6/1996 | Sasame et al. |
| 5,672,848 | A | 9/1997 | Komorita et al. |
| 5,807,626 | A | 9/1998 | Naba |
| 5,955,686 | A | 9/1999 | Sakuraba et al. |
| 5,965,193 | A | 10/1999 | Ning et al. |
| 5,980,683 | A | 11/1999 | Beck et al. |
| 5,998,041 | A | 12/1999 | Makino et al. |
| 6,069,023 | A | 5/2000 | Bernier et al. |
| 6,221,511 | B1 | 4/2001 | Sakuraba et al. |
| 6,348,273 | B1 | 2/2002 | Ishikawa et al. |
| 6,390,354 | B1 | 5/2002 | Makino et al. |
| 6,440,578 | B1 | 8/2002 | Shinkai et al. |
| 2002/0050585 | A1* | 5/2002 | Masayuki et al. .......... 252/500 |

FOREIGN PATENT DOCUMENTS

| | | |
|---|---|---|
| EP | 0 937 536 A1 | 8/1999 |
| JP | 2-197368 | 8/1990 |
| JP | 5-508350 | 11/1993 |
| JP | 7-309688 | 11/1995 |
| JP | 9-283656 | 10/1997 |
| JP | 10-270596 | 10/1998 |
| JP | 11-228245 | 8/1999 |
| JP | 11-269577 | 10/1999 |

* cited by examiner

Prior Art

US 7,170,186 B2

LAMINATED RADIATION MEMBER, POWER SEMICONDUCTOR APPARATUS, AND METHOD FOR PRODUCING THE SAME

CROSS REFERENCE TO RELATION APPLICATIONS

This application is a Continuation application of U.S. application Ser. No. 10/242,862 filed Sep. 13, 2002, now abandoned which is a Divisional application of U.S. application Ser. No. 09/774,206 filed Jan. 30, 2001, now U.S. Pat. No. 6,485,816, the entireties of which are incorporated herein by reference.

BACKGROUND OF THE INVENTION

The present invention relates to a laminated radiation member, a power semiconductor apparatus, and a method for making the same.

A known power semiconductor apparatus is, for example, one which is composed of the main part as shown in FIG. 4. In FIG. 4, 101 indicates a power semiconductor apparatus, 102 indicates a semiconductor chip comprising IGBT or the like, 103 indicates a metal base plate for radiating the heat generated from the semiconductor chip 102, 104 indicates a ceramic plate comprising aluminum nitride or the like for insulating the semiconductor chip 102 from the metal base plate 103, 105a indicates a first metal electrode provided above the upper surface of the ceramic plate 104, 105b indicates a second metal electrode provided below the lower surface of the ceramic plate 104, 106a indicates a first hard solder paste for bonding the ceramic plate 104 to the first metal electrode 105a, 106b indicates a second hard solder paste for bonding the ceramic plate 104 to the second metal electrode 105b, 107a indicates a first solder for bonding the semiconductor chip 102 to the first metal electrode 105a, 107b indicates a second solder for banding the metal base plate 103 to the second metal electrode 105b, 108a indicates a first metal wire comprising aluminum to be connected to the semiconductor chip 102, 108b indicates a second metal wire comprising aluminum to be connected to the first metal electrode 105a, and 109 indicates a silicone gel which covers the semiconductor chip 102, the ceramic plate 104, the first metal electrode 105a and the second metal electrode 105b and seals them.

The conventional power semiconductor apparatus having the above construction is usually made by the following method. In the case of making the conventional power semiconductor apparatus 101, first, hard solder pastes, which are the first and second hard solder pastes 106a and 106b, are printed at a given thickness on both surfaces of the ceramic plate 104. Then, two metal electrodes, which are the first and second metal electrodes 105a and 105b, are put on the hard solder pastes printed on both the surfaces of the ceramic plate 104 and heat treated at a given temperature, for example, about 850° C., thereby bonding the first and second metal electrodes to both surfaces of the ceramic plate 104.

Thereafter, the ceramic plate 104, to both surfaces of which the metal electrodes are bonded is bonded, to the metal base plate 103 with a high-temperature solder (melting point: about 260° C.) which is the second solder 107b, and the semiconductor chip 102 is bonded with a low-temperature solder (melting point: about 150° C.), which is the first solder 107a, to both surfaces of the ceramic plate 104 on which the metal electrodes are bonded. A metal wire, which is the first metal wire 108a, is connected to the semiconductor chip 102 by wire bonding, and a metal wire, which is the second metal wire 108b, is connected to the metal electrode which is the first metal electrode 105a by wire bonding.

Usually, the metal base plate 103 on which the semiconductor chip 102, the ceramic plate 104, the first metal electrode 105a and the second metal electrode 105b, and the like are mounted is contained in a package. Silicone gel 109 is vacuum injected into the package and cured by heating, whereby the semiconductor chip 102, the ceramic plate 104, the first metal electrode 105a and the second metal electrode 105b, and the like are covered with the silicone gel 109 and sealed. In this way, the conventional power semiconductor apparatus 101 is made.

However, since the insulation substrate (104) and the metal electrodes (105a,b) are bonded with the hard solders (106a,b), cracks occur due to the difference in expansion coefficient between the insulation substrate, which has a low thermal expansion coefficient, and the hard solders and metal electrodes, which have high thermal expansion coefficients. Furthermore, since the insulation substrate (104) and the radiation plate (103) are connected with solder, there is the problem of high thermal resistance.

On the other hand, as an example of using no solder for bonding of an insulation plate and a radiation plate, JP-A-11-269577 proposes a method of forming a metal base composite material having a heat sink function by a chemical process utilizing a reaction between a ceramic dispersion material and a molten metal. This method suffers from the problem that since the molten metal is high-pressure injected into the ceramic dispersion material, expensive facilities are required, causing an increase of cost. There may be considered a means to carry out the reaction under impregnating the ceramic dispersion material with molten metal, but in this case, there is the problem that the penetrating speed is slow. In this method, the insulation substrate and the metal base composite material as a radiation plate are connected with a metal film or are connected with disposing a compound containing a firing aid for the insulation substrate at the bonded surface between the insulation substrate and the metal film, and therefore the thermal conductivity is better than the case of connecting with a solder. However, occurrence of cracks caused by difference in thermal expansion coefficient between the insulation plate of low thermal expansion coefficient and the metal film of high thermal expansion coefficient or the metal film provided with a compound containing firing aid for the insulation substrate cannot sometimes be avoided.

As an example of using no metallic radiation plate, there is, for example, an aluminum-silicon carbide composite material known as a metal ceramics composite material. This composite material is generally prepared by making a molded body (preform) of ceramic particles, ceramic fibers, whiskers, etc., then impregnating the preform with a molten metal and cooling it. As the method for impregnating with molten metal, there are various known methods such as a method based on powder metallurgy, a method according to high-pressure casting, e.g., die casting (JP-A-5-508350), a melt forging method ("Material," Vol. 36, No. 1, 1997, pages 40–46), spontaneous penetrating method (JP-A-2-197368), etc.

On the other hand, as power semiconductor apparatuses, there are known, for example, those which comprise a semiconductor chip comprising IGBT or the like, a metal base plate of about 4 mm thick comprising copper or the like for radiating heat generated from the semiconductor chip, and a ceramic plate of about 0.6 mm thick comprising aluminum nitride or the like for insulating the semiconductor chip from the metal base plate. A first metal electrode of about 0.4 mm thick comprising copper or the like is bonded to the upper surface of the ceramic plate with a first hard solder of a given thickness. A semiconductor chip is bonded to the upper surface of the metal electrode with a solder of about 0.2 mm thick. A second metal electrode of about 0.2 mm thick comprising copper or the like is bonded to the under surface of the ceramic plate with a second solder of a given thickness. The under surface of the ceramic plate and the second metal electrode are bonded to the radiation plate with a solder or a hard solder.

However, there is a problem of low radiation property because the insulating ceramic substrate and the radiation plate are connected with a solder. Moreover, in the case of bonding the insulating ceramic substrate and the metallic heat sink material with a hard solder by active metal method or the like, cracks caused by thermal stress at the time of bonding occur on the side of the insulating ceramic substrate because of the great difference in thermal expansion coefficient between both the materials. Furthermore, a multi-layer type bonded body, which is bonded with a solder and provided with a stress relaxing layer by a means other than soldering, is low in endurance when exposed to thermal cycles of cooling-heating and, besides, increases in thermal resistance due to the increase of bonded interfaces which inhibits radiation. Moreover, since stress relaxation is conducted by employing a multi-layer structure, the number of production steps necessarily increases, and, as a result, this causes an increase of production cost. This is a serious problem.

On the other hand, as a method of bonding different members, the applicant of the present application disclosed in application JP-A-11-228245, utilizing an adhesive composition comprising ceramic fine particles and a hard solder and capable of reducing thermal stress. However, the object of the invention disclosed in the above application is to inhibit the decrease of bonding strength and the occurrence of cracks during the cooling operation, mainly after bonding, in making members by bonding the different members and need airtightness. The patent application makes no mention which suggests improvement of endurance in a use environment, such as increasing peeling resistance and effectively inhibiting cracking at bonded portions under severe thermal cycles, where high temperature-low temperature with cooling operation is repeated many times, in applications such as heat sinks, laminated radiation members and power semiconductor apparatuses. That is, of course, the application does not have descriptions suggesting that the products can function as a bonding layer of heat sinks, laminated radiation members and power semiconductor apparatuses.

SUMMARY OF THE INVENTION

As mentioned above, the object of the present invention is to provide a laminated radiation member as a power semiconductor apparatus which is substantially free from cracks generated due to a difference in the thermal expansion coefficient between an insulation substrate and a radiation plate, and which is excellent in radiation properties and thermal cycle characteristics, and a method for making the laminated radiation member.

Figure 1:
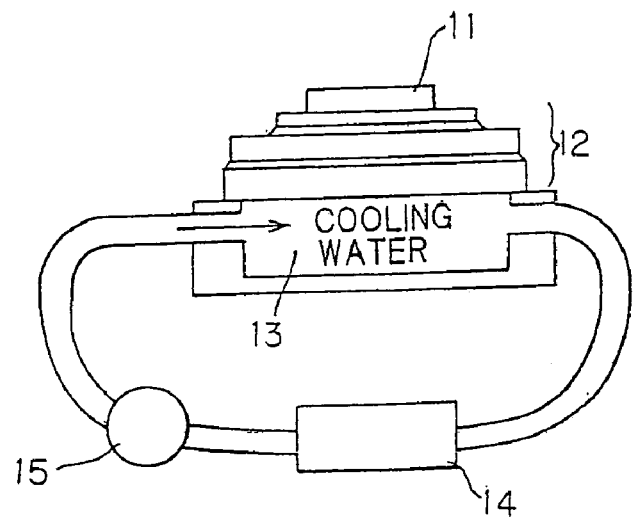
FIG. 1 is a schematic view of a water cooling module used in the test.
Figure 2:
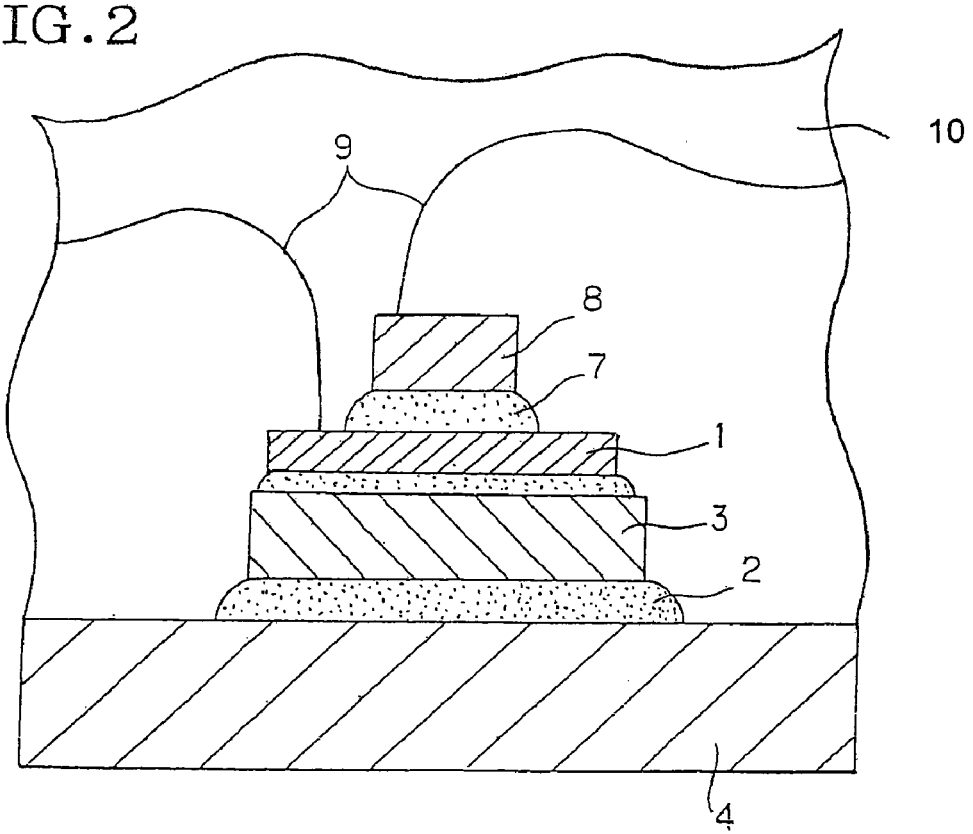
FIG. 2 is a sectional view showing the construction of the main part of the power semiconductor apparatus according to the present invention.

In the drawings, the following reference numerals represent:

(1) Circuit electrode; (2) Bonding layer (metal base composite material); (3) Insulation substrate; (4) Radiation plate; (5) Mixture of ceramic particles and active metal; (6) Mold; (7) Solder; (8) Semiconductor chip; (9) Metal wire; (10) Insulating sealer; (11) Heater; (12) Module; (13) Flow path; (14) Water bath with pump; and (15) Flow meter.

DETAILED DESCRIPTION OF THE INVENTION

As a result of intensive research conducted by the inventors in an attempt to attain the above object, it has been found that a laminated radiation member which is substantially free from cracking caused by a difference in the thermal expansion coefficient between an insulation substrate and a radiation plate, and which is excellent in radiation properties, can be produced by forming a metal base composite material using a specific ceramic dispersion material and a hard solder, and bonding an insulation substrate and a radiation plate with the metal base composite material interposed between them. Thus, the present invention has been accomplished.

That is, firstly, the present invention provides a laminated radiation member comprising a radiation plate, an insulation substrate bonded to the upper surface of the radiation plate and an electrode provided on the upper surface of the insulation substrate, wherein the radiation plate and the insulation substrate are bonded with a metal base composite material in which ceramic particles are dispersed and which is present between the radiation plate and the insulation substrate.

The present invention further provides a laminated radiation member, wherein the metal base composite material layer is produced by providing ceramic dispersion particles which are previously surface treated so as to assure wettability with a hard solder or a metal, and reacting the ceramic particles with the molten solder or metal and penetrated between the ceramic dispersion particles. The reaction is carried out in the space between the radiation plate, the bonding surface of which may be, if necessary, previously surface treated so as to assure wettability with the solder or the metal, and the insulation substrate, the bonding surface of which may also be, if necessary, previously surface treated so as to assure wettability with the solder or the metal.

The present invention further provides a laminated radiation member, wherein the metal base composite material layer is produced by reacting the ceramic dispersion particles with a hard solder or a metal molten penetrated between the ceramic dispersion particles. The solder or metal further contains at least one of an active metal selected from the group consisting of Ti, Zr, Nb, Ta and Hf, or, the active metal powders are previously dispersed in the space between the ceramic dispersion particles. The laminated radiation member is characterized in that the insulation substrate comprises aluminum nitride or silicon nitride and further characterized in that the insulation substrate and the electrode provided on the upper surface of the insulation substrate are bonded with the metal base composite material layer in which ceramic particles are dispersed and which is interposed between the insulation substrate and the electrode.

Secondly, the present invention provides a power semiconductor apparatus comprising a circuit electrode, a laminated radiation member comprising a radiation plate and an insulation substrate, a semiconductor chip bonded to the circuit electrode formed at the laminated radiation member and a metal wire electrically connected to the semiconductor chip, the semiconductor chip, the laminated radiation member and the circuit electrode being sealed with an insulation sealer, characterized in that the laminated radiation member is one of the laminated radiation members enumerated above.

Thirdly, the present invention provides a method for making a laminated radiation member comprising a radiation plate, an insulation substrate bonded to the upper surface of the radiation plate and an electrode provided on the upper surface of the insulation substrate. The method includes a step of, if necessary, previously surface treating a bonding surface of the radiation plate and/or the insulation substrate so as to assure wettability with a hard solder or a metal, a step of interposing ceramic particles previously surface treated so as to assure wettability with a hard solder or a metal between the radiation plate and the insulation substrate, a step of disposing a hard solder above and/or below the ceramic particles, a step of heating the solder to a temperature higher than the melting point of the solder to melt the solder, a step of penetrating the molten solder into spaces between the ceramic particles to react the ceramic particles with the solder to produce a metal base composite material, and a step of bonding the radiation plate and the insulation substrate with the metal base composite material present between them.

The present invention further provides a method for making a laminated radiation member, wherein the surface treatment of the ceramic particles and/or the insulation substrate and/or the radiation plate for assuring the wettability, is a coating treatment of at least a part of the surface with a metal. This treatment is electroless plating, plating, sputtering, chemical vapor deposition, vacuum deposition, or ionic plating. The method for making a laminated radiation member comprising a radiation plate, an insulation substrate bonded to the upper surface of the radiation plate and an electrode provided on the upper surface of the insulation substrate, is further characterized by including a step of interposing the ceramic particles between the radiation plate and the insulation substrate, a step of disposing a hard solder containing at least one of an active metal selected from the group consisting of Ti, Zr, Nb, Ta and Hf above and/or below the ceramic particles, a step of heating the solder to a temperature higher than the melting point of the solder to melt the solder, a step of penetrating the molten solder into spaces between the ceramic particles to react the ceramic particles with the solder to produce a metal base composite material, and a step of bonding the radiation plate and the insulation substrate with the metal base composite material present between them.

The present invention further provides a method for making a laminated radiation member comprising a radiation plate, an insulation substrate bonded to the upper surface of the radiation plate and an electrode provided on the upper surface of the insulation substrate, including a step of interposing ceramic particles and active metal powders selected from the group consisting of Ti, Zr, Nb, Ta and Hf between the radiation plate and the insulation substrate, a step of disposing a hard solder above and/or below the ceramic particles, a step of heating the solder to a temperature higher than the melting point of the solder to melt the solder, a step of penetrating the molten solder into spaces between the ceramic particles to react the ceramic particles with the solder to produce a metal base composite material, and a step of bonding the radiation plate and the insulation substrate with the metal base composite material present between them.

In addition, the present invention provides a method for making a laminated radiation member comprising a radiation plate, an insulation substrate bonded to the upper surface of the radiation plate and an electrode provided on the upper surface of the insulation substrate, including a step of placing the insulation plate in a solidification mold, a step of disposing ceramic particles on one surface of the insulation substrate, a step of pouring a molten metal into the solidification mold to impregnate the ceramic particles with the molten metal and, simultaneously with the impregnation, pouring the molten metal into the portion where the ceramic particles are not present, and a step of solidifying the molten metal to form the radiation plate in the portion where the ceramic particles are not present. The method is further characterized by including a step of bonding the insulation substrate and the electrode with a hard solder or a metal base composite material present between them, simultaneously with the heat treatment for bonding the radiation plate and the insulation substrate with the metal base composite material present between them.

The present invention further provides a method for making a laminated radiation member, characterized by further including a step of bonding the electrode to the insulation substrate with the hard solder or the metal base composite material by a heat treatment at a temperature lower than the temperature at the bonding step of the radiation plate and the insulation substrate, the insulation substrate being bonded to the insulation substrate with the metal base composite material present between them. A method for making a laminated radiation member is also provided, including a step of forming an electrode at a temperature lower than the temperature at the bonding step of the radiation plate and the insulation substrate on the insulation substrate bonded to the radiation plate with the metal base composite material. A method for making a laminated radiation member is provided, characterized in that the step of forming the electrode at a lower temperature comprises electroless plating, plating, sputtering, ionic plating, chemical vapor deposition, vacuum deposition or flame spraying, or combination of them.

Fourthly, the present invention further provides a method for making a power semiconductor apparatus, including a step of bonding a semiconductor chip to an electrode of a laminated radiation member comprising a radiation plate, an insulation substrate bonded to the upper surface of the radiation plate and an electrode provided on the upper surface of the insulation substrate, the radiation plate and said insulation substrate being bonded to each other with a metal base composite material layer in which ceramic particles are dispersed and which is present between the radiation plate and the insulation substrate, a step of electrically connecting metal wires to the semiconductor chip and the electrode, respectively, a step of placing in a package the semiconductor chip, the laminated radiation member and the circuit electrode, and then providing an insulating sealer in the package. Moreover, the present invention provides a method for making a power semiconductor apparatus, characterized in that the laminated radiation member is made by one of the methods mentioned above as the third aspect.

According to the above methods of the present invention, bonding of the insulation substrate and the radiation plate is carried out with the metal base composite material layer present therebetween. That is, the desired laminated radiation member and power semiconductor apparatus, which are excellent in thermal conductivity and thermal cycle characteristics, can be obtained by a step of, if necessary, previously surface treating a bonding surface of the radiation plate and/or the insulation substrate so as to assure wettability with a hard solder or a metal, a step of interposing ceramic particles previously surface treated so as to assure wettability with a hard solder or a metal between the radiation plate and the insulation substrate, a step of disposing a hard solder above and/or below the ceramic particles, a step of heating the solder to a temperature higher than the melting point of the solder to melt the solder material, a step of penetrating the molten solder into spaces between the ceramic particles to react the ceramic particles with the solder to form a metal base composite material low in thermal resistance and high in radiation properties as a bonding layer, and a step of bonding the radiation plate and the insulation substrate with the metal base composite material present therebetween.

The present invention will be explained in more detail below. The term "metal base composite material layer" in the present specification means a layer comprising a composite material which can be produced by melting and mixing a hard solder and ceramic particles subjected to a specific surface treatment and capable of reducing a specific thermal stress.

The laminated radiation member as a power semiconductor apparatus according to the present invention can be made in the following manner. A ceramic dispersing material previously subjected to plating, such as SiC particles subjected to Ni—B plating treatment, is placed on a plated surface of a radiation plate which may be previously subjected to plating treatment. A pressure is applied thereto to reduce the thickness and increase packing rate of the particles. A hard solder such as a BA4004 (Al-10Si-1.5Mg) sheet, which is an aluminum solder, is placed thereon, and thereon is placed an insulation substrate (both surfaces of which are subjected to plating treatment). Further thereon is placed a ceramic dispersing material previously subjected to plating treatment, such as the above SiC particles subjected to Ni—B plating, followed by applying a pressure and increasing packing rate of the particles. Thereon is placed a hard solder such as a BA4004 (Al-10Si-1.5Mg) sheet, which is an aluminum solder, and further thereon is placed a thin copper sheet for the formation of a circuit. Thereafter, the resulting stack is subjected to a heat treatment at a given temperature in a vacuum and the respective components are bonded with metal base composite material layers present therebetween.

In the present invention, as the insulation substrate, ceramic substrates having a thickness of 0.1–2 mm may be used, preferably ones such as aluminum nitride and silicon nitride having a thickness of 0.1–2 mm. Especially preferred are silicon nitride substrates disclosed in JP-A-4-212441 and silicon nitride substrates disclosed in JP. Appln. No.11-176479 filed on Jun. 23, 1999 from the points of thermal conductivity and assurance of bonding strength.

The insulation substrate is preferably previously surface treated for assuring wettability with the hard solder. As the dispersing materials comprising ceramic particles which reduce thermal stress, ceramic particles, such as SiC, AlN, $Si_3N_4$, and $Al_2O_3$, having a particle diameter of preferably 5–200 μm, and more preferably, 10–50 μm, may be used. Usually, they are surface treated for assuring wettability with the hard solder and uniformly spread over the insulation substrate placed, for example, in a heat resistant container.

Of course, for bonding of the insulation substrate and the radiation plate, a hard solder comprising at least one metal or metal alloy selected from Al, Al alloy, copper and copper alloy is used together with the ceramic dispersing material for the formation of the bonding layer. The hard solder disposed above and/or under the particles of the ceramic dispersing material is interposed between the radiation plate and the insulation substrate, followed by melting it to form a metal base composite material which is the bonding layer. Usually, the hard solder is placed on ceramic dispersing material uniformly spread over the radiation plate disposed in a heat resistant container, and the insulation substrate is further mounted thereon, followed by heating and melting the solder to penetrate it into the spaces between the particles of the ceramic dispersing material, and solidifying it to form the desired bonding layer, namely, a metal base composite material. This is preferably affected by heating to a temperature 50–100° C. higher than the melting point of the above-mentioned metal or alloy in a furnace of vacuum or inert atmosphere. The formation of the bonding layer by penetration of the metal or the alloy can be completed in a shorter time as compared with the similar conventional technique utilizing the above reaction, and, hence, the retention time at the above temperature can be not longer than 10 minutes.

In this case, the surface treatment of the insulation substrate, the radiation plate and the dispersing material, which is the ceramic particles, can comprise forming a layer of Ni, Cu, Pd, or the like on the surface of the ceramic dispersing material by electroless plating, plating, sputtering, ion plating, chemical vapor deposition, vacuum deposition and the like. However, in the case of using mainly Al alloy as the hard solder, electroless Ni plating is suitable. In this case, the thickness of the plating layer is preferably not more than 1 μm, more preferably about 0.5 μm. If the thickness is less than 0.5 μm, penetration of the solder does not properly occur, and if it is more than 1 μm, thermal conductivity may be deteriorated owing to production of an intermetallic compound ($Al_3Ni$) in a large amount.

For the assurance of wettability, it is also possible to add an active metal such as Ti, Nb, Hf, Ta or Zr to the melt of metal comprising the solder and forming a nitride, oxide or carbide of these active metals on the surface of the insulation substrate and the ceramic dispersing material. The amount of the active metal added is suitably 0.5–20% by weight based on the solder. The metal may be previously added to the solder, but when fine particles of the active metal are previously added to the ceramic dispersing material, since the amount of the active metal to be added can be smaller, the thermal conductivity of the resulting composite material can be maintained at high level. Thus, this is preferred. This may be combined with the method of subjecting the surface of the ceramic dispersing material to said plating treatment.

In reacting the ceramic dispersing material with the molten hard solder to form a composite material, when those surface treated by electroless plating, plating, sputtering, chemical vapor deposition, vacuum deposition, or ion plating are used, local exothermic reaction (burning synthesis reaction) takes place in the case of contacting of the surface treatment layer with the molten metal to cause reaction. For example, in the case of the surface treatment layer being an electroless Ni—B plating and the molten metal being an Al-based alloy, Ni aluminide is produced in accordance with the reaction formula: Al+Ni→Al$_3$Ni, and the generated heat causes an exothermic reaction. Therefore, substantially no pressure is needed, and the wettability between the ceramic dispersing material/the molten metal is markedly improved by the above-mentioned local exothermic reaction, and, as a result, penetration speed of the molten metal is increased and the metal base composite material can be formed in a very short time.

Furthermore, when an active metal is utilized for forming a composite material of the ceramic dispersing material and the melt of metal constituting the hard solder, since the active metal (Ti, Zr, Nb, Ta, Hf or the like) is highly active for oxygen, nitrogen and carbon, wettability between the ceramic dispersing material and the molten metal is improved by dissolution of the active metal in the molten metal to form a solid solution, and microscopically an interface reaction with the melt containing the active metal takes place on the surface of the ceramic dispersing material. That is, in the case of the ceramic dispersing material being SiC and the molten metal being Cu—Ti alloy, an exothermic reaction with formation of TiC takes place according to the reaction of SiC+Ti→TiC+Si (in copper). Thus, as above, this local exothermic reaction increases penetration speed of the molten metal, and the metal base composite material can be produced in a very short time.

As the radiation plate, metallic plates such as of copper, aluminum, silver, and the like, which are generally used for power semiconductor apparatus, or plates made of alloys such as Cu—Be or composite materials such as Cu—Mo, Cu—SiC, and the like may be suitably used. In bonding the radiation plates made of composite materials, it is preferred to use those surface treated by the above methods in the same manner as of the dispersing materials comprising ceramic particles. Formulation of the radiation plates has no limitation, and those of the same as used for other power semiconductor apparatuses can be used without any problems. As to members other than those mentioned above, naturally those generally used in power semiconductor apparatuses can be used without any problems.

In the method of the present invention, the electrode can be formed simultaneously with the bonding of the radiation plate and the insulation substrate as in the case of Example 1, or it may be separately formed. When the electrode is formed separately, it can be solder-bonded using a hard solder which melts at lower than the bonding temperature of the radiation plate and the insulation substrate. In this case, the electrode may be bonded with the metal base composite material layer in the same manner as in the bonding of the radiation plate and the insulation substrate. Furthermore, as a method of separate molding, the electrode can also be made freshly by printing, flame spraying, plating or the like, instead of by bonding.

The present invention will be explained in more detail by the following examples. These examples should not be construed as limiting the invention in any manner.

Measurements of characteristics in the examples were conducted by the following methods.

Thermal Cycle Characteristics

In the air, a sample was subjected to cycles, one cycle of which comprises holding the sample for 30 minutes in a low temperature cryostat kept at −40° C., then leaving the sample for 10 minutes in a thermostat kept at 25° C., furthermore raising the temperature of the thermostat to 125° C. and holding the sample therein for 30 minutes, and lowering the temperature of the thermostat to 25° C. and leaving the sample therein for 10 minutes. Five samples were prepared for each kind of samples, and the thermal cycle characteristics of the respective samples were evaluated in terms of the number of cycles when even one of the five had cracks in the insulation substrate or showed separation at the bonded portion of the radiation plate.

Heat Resistant Characteristics

A water-cooling module as shown in FIG. 1 was made, and a heater was adhered to the surface of the circuit-formed portion of the insulation substrate with an Ag paste. Cooling water of 24° C. was circulated at a flow rate of 2 l/min, and temperatures of the heater surface and the interface of sample/running water were measured, and heat resistance of the sample was calculated. Relative evaluation of the heat resistance was conducted with assuming the resistance of Comparative Example 1 to be 1.0.

EXAMPLE 1

Ni Plating Method/Upper Electrode Simultaneous Bonding

As the insulation substrate, a silicon nitride insulation substrate of 50 mm×40 mm×0.3 mm having a thermal conductivity of 90 W/mK was prepared by adding Y$_2$O$_3$ and MgO as firing assistants to a commercially available silicon nitride powder and firing the mixture at a given temperature for a given period. Separately, a radiation plate (80 mm×50 mm×3 mm) comprising a Cu—SiC composite material and having a thermal conductivity of 250 W/mK was prepared by the method disclosed in JP-A-11-029379.

Separately, the surface of commercially available SiC particles (average particle diameter: about 50 µm) was subjected to Ni—B plating at a thickness of about 0.5 µm by wet electroless plating. On the other hand, both sides of the above silicon nitride insulation substrate were subjected to electroless Ni—B plating at a thickness of about 1 µm. One side of the above Cu—SiC radiation plate was also subjected to electroless Ni—B plating at a thickness of about 1 µm. The above Ni—B plated SiC particles were disposed on the Ni—B plated surface of the Cu—SiC radiation plate, followed by applying a pressure to reduce the thickness to improve the packing rate of the particles. On the upper surface thereof was placed an Al solder sheet (BA4004: Al-10Si-1.5Mg) and thereon was placed the silicon nitride insulation substrate subjected to Ni—B plating on both the sides. Furthermore, Ni—B plated SiC particles were disposed on the upper surface thereof, followed by applying a pressure to reduce the thickness to improve the packing rate of the particles. On the upper surface thereof was placed an Al solder sheet (BA4004: Al-10Si-1.5Mg). Then, a copper sheet 0.3 mm thick was placed on the upper surface of the solder sheet.

Then, the resulting stack was heated to 700° C. at a heating rate of 15° C./min in a vacuum of 0.00133 Pa and kept at 700° C. for 3 minutes, and then slowly cooled to room temperature at a cooling rate of 2° C./min to prepare a bonded body (laminated radiation member). In this bonded body, the Cu—SiC radiation plate and the silicon nitride insulation substrate were bonded with a composite material layer of SiC/aluminum solder present between the radiation plate and the substrate, and the silicon nitride insulation substrate and the uppermost copper sheet 0.3 mm thick were also bonded with a composite material layer of SiC/aluminum solder.

Then, a resist for the formation of circuits was printed on the whole surface of the thus obtained laminated radiation member, then only the portions which were not etched later were selectively cured, the uncured portions were removed, and the exposed copper was etched with an aqueous cupric chloride solution to form a circuit pattern of the uppermost copper sheet of the laminated radiation member. Furthermore, this was washed with an aqueous acid ammonium fluoride solution and additionally washed with water several times to remove the solder between the circuits.

Then, the resist was peeled off and finally the surface of the uppermost copper sheet (=circuit sheet) was subjected to Ni—P plating to form a protective layer, thereby making a laminated radiation member.

EXAMPLE 2

Ni Plating Method/Upper Electrode Simultaneous Bonding

A laminated radiation member was made in the same manner as in Example 1, except that a commercially available pure copper plate (oxygen-free copper of pure copper composition or tough pitch copper, 80×50×3 mm: radiation plate) having a thermal conductivity of 390 W/mK was prepared in place of preparing the Cu—SiC composite material (80×50×3 mm: radiation plate), and a commercially available $Al_2O_3$ powder (average particle diameter: about 40 μm) was used in place of the commercially available SiC particles (average particle diameter: about 50 μm).

EXAMPLE 3

Powder Active Metal Method/Upper Electrode Simultaneous Bonding

A silicon nitride insulation substrate of 50×40×0.3 mm having a thermal conductivity of 90 W/mK was prepared by adding $Y_2O_3$ and MgO as firing assistants to a commercially available silicon nitride powder and firing the mixture at a given temperature for a given period. Separately, a commercially available pure copper plate (oxygen-free copper of pure copper composition or tough pitch copper, 80×50×3 mm: radiation plate) having a thermal conductivity of 390 W/mK was prepared.

On the other hand, a mixture of AlN pulverized powder (average particle diameter: 50 μm) and Ti powder (average particle diameter: 44 μm) was placed, followed by applying a pressure to reduce the thickness to improve the packing rate of the particles, and this was placed on the upper surface of the above radiation plate. On the upper surface thereof was placed a commercially available silver solder sheet (BAg-8: Ag-28Cu) and thereon was placed the above silicon nitride insulation substrate. On the upper surface thereof, was further placed a mixture of AlN pulverized powder (average particle diameter: 50 μm) and Ti powder, followed by applying pressure to reduce the thickness to improve packing rate of the particles, and moreover, on the upper surface thereof was placed a commercially available silver solder sheet (BAg-8: Ag-28Cu). Furthermore, a copper sheet of 0.3 mm thick was placed on the upper surface thereof.

Then, the resulting stack was kept at 800° C. for 3 minutes in a vacuum of 0.00133 Pa and then slowly cooled to prepare a bonded body (laminated radiation member). In this bonded body, the Cu—SiC radiation plate and the silicon nitride insulation substrate were bonded with a composite material layer of AlN/silver solder present between the radiation plate and the substrate, and the silicon nitride insulation substrate and the uppermost copper sheet 0.3 mm thick were also bonded with a composite material layer of AlN/silver solder present therebetween.

Then, a resist for the formation of circuits was printed on the whole surface of the thus obtained laminated radiation member, then only the portions which were not etched later were selectively cured, then the uncured portions were removed, and the exposed copper was etched with an aqueous cupric chloride solution to form a circuit pattern of the uppermost copper sheet of the laminated radiation member. Furthermore, this was washed with an aqueous acid ammonium fluoride solution and additionally washed with water several times to remove the solder between the circuits.

Then, the resist was peeled off and finally the surface of the uppermost copper sheet (=circuit sheet) was subjected to Ni—P plating to form a protective layer, thereby obtaining a laminated radiation member.

EXAMPLE 4

Solid Solution Active Metal method/Upper Electrode Simultaneous Bonding

A silicon nitride insulation substrate of 50×40×0.3 mm having a thermal conductivity of 90 W/mK was prepared by adding $Y_2O_3$ and MgO as firing assistants to a commercially available silicon nitride powder and firing the mixture at a given temperature for a given period. Separately, a commercially available pure copper plate (oxygen-free copper of pure copper composition or tough pitch copper, 80×50×3 mm: radiation plate) having a thermal conductivity of 390 W/mK was prepared.

On the other hand, a commercially available SiC particles (average particle diameter: 50 μm) were placed, followed by applying pressure to reduce the thickness to improve packing rate of the particles, and this was placed on the upper surface of the above radiation plate. On the upper surface thereof was placed a Cu—Ti hard solder (Cu-15Ti) sheet and thereon was further placed the above silicon nitride insulation substrate. On the upper surface thereof, were further placed commercially available SiC particles (average particle diameter: 50 μm), followed by applying pressure to reduce the thickness to improve packing rate of the particles, and moreover, on the upper surface thereof was placed a Cu—Ti hard solder (Cu-15Ti) sheet. Furthermore, a copper sheet 0.3 mm thick was placed on the upper surface thereof.

Then, the resulting stack was kept at 1000° C. for 30 minutes in a vacuum of 0.00133 Pa and then slowly cooled to prepare a bonded body (laminated radiation member). In this bonded body, the pure copper radiation plate and the silicon nitride insulation substrate were bonded with a composite material layer of SiC/Cu—Ti solder present between the radiation plate and the substrate, and the silicon nitride insulation substrate and the uppermost copper sheet of 0.3 mm thick were also bonded with a composite material layer of SiC/Cu—Ti solder present therebetween.

Then, a resist for the formation of circuits was printed on the whole surface of the thus obtained laminated radiation member, then only the portions which were not etched later were selectively cured, then the uncured portions were removed, and the exposed copper was etched with an aqueous cupric chloride solution to form a circuit pattern of the uppermost copper sheet of the laminated radiation member. Furthermore, this was washed with an aqueous acid ammonium fluoride solution and additionally washed with water several times to remove the solder between the circuits.

Then, the resist was peeled off and finally the surface of the uppermost copper sheet (=circuit sheet) was subjected to Ni—P plating to form a protective layer, thereby obtaining a laminated radiation member.

EXAMPLE 5

Ni Plating Method/Upper Electrode Simultaneous Bonding

A sample was made in the same manner as in Example 1, except that silicon nitride insulation substrate of 50×40× 0.635 mm having a thermal conductivity of 180 W/mK was prepared by adding $Y_2O_3$ as firing assistants to a commercially available silicon nitride powder and firing the mixture at a given temperature for a given period.

EXAMPLE 6

Preparation of Upper Electrode Using Hard Solder Having a Melting Point Lower Than Hard Solder for Bonding to Radiation Plate A silicon nitride insulation substrate of 50×40×0.3 mm having a thermal conductivity of 90 W/mK was prepared by adding $Y_2O_3$ and MgO as firing assistants to a commercially available silicon nitride powder and firing the mixture at a given temperature for a given period. Separately, a Cu—SiC composite material (80×50×3 mm: radiation plate) having a thermal conductivity of 250 W/mK was prepared by the method disclosed in JP-A-11-029379.

Separately, the surface of commercially available SiC particles (average particle diameter: 50 μm) was subjected to Ni—B plating at a thickness of about 0.5 μm by wet electroless plating. On the other hand, one side of the above silicon nitride insulation substrate was subjected to electroless Ni—B plating at a thickness of about 1 μm. Furthermore, one side of the above Cu—SiC composite material radiation plate was also subjected to electroless Ni—B plating at a thickness of about 1 μm. The above Ni—B plated SiC particles were disposed on the Ni—B plated surface of the radiation plate, followed by applying pressure to reduce the thickness to improve packing rate of the particles. On the upper surface thereof was placed a silver hard solder sheet (BAg-8: Ag-28Cu) and thereon was further placed the silicon nitride insulation substrate subjected to Ni—B plating on one side so that the Ni—B plated surface contacted the solder sheet.

Then, the resulting stack was kept at 800° C. for 3 minutes in a vacuum of 0.00133 Pa and then slowly cooled to prepare a bonded body (laminated radiation member). In this bonded body, the Cu—SiC radiation plate and the silicon nitride insulation substrate were bonded with a composite material layer of SiC/silver solder present between the radiation plate and the substrate.

Then, an Al solder (BA4004: Al-10Si-1.5Mg) sheet was placed on the silicon nitride insulation substrate of the laminated radiation member, and thereon was placed a copper sheet 0.3 mm thick, followed by heat treating them in this state at 700° C. for 3 minutes in vacuum in this state to obtain a composite bonded member.

Then, a resist for the formation of circuits was printed on the whole surface of the thus obtained laminated radiation member, then only the portions which were not etched later were selectively cured, then the uncured portions were removed, and the exposed copper was etched with an aqueous cupric chloride solution to form a circuit pattern of the uppermost copper sheet of the laminated radiation member. Furthermore, this was washed with an aqueous acid ammonium fluoride solution and additionally washed with water several times to remove the solder between the circuits.

Then, the resist was peeled off and finally the surface of the uppermost copper sheet (=circuit sheet) was subjected to Ni—P plating to form a protective layer, thereby obtaining a laminated radiation member.

EXAMPLE 7

Preparation of Upper Electrode Using Composite Hard Solder Having a Melting Point Lower Than Hard Solder for Bonding to Radiation Plate A bonded body (laminated radiation member) in which the Cu—SiC radiation plate and the silicon nitride insulation substrate were bonded with a composite material layer of SiC/silver solder present between the radiation plate and the substrate was made in the same manner as in Example 6, except that both sides of the silicon nitride insulation substrate were subjected to electroless Ni—B plating at a thickness of about 1 μm.

Then, the above Ni—B plated SiC pulverized powder was placed on the surface of the silicon nitride insulation substrate which was subjected to electroless Ni—B plating of about 1 μm thick in the above laminated radiation member, followed by applying pressure thereto to reduce the thickness to improve packing rate of particles. On the upper surface thereof was placed a commercially available aluminum solder sheet (BA4004: Al-10Si-1.5Mg), and on the upper surface thereof was further placed a copper sheet of 0.3 mm thick.

Then, the resulting stack was kept at 700° C. for 3 minutes in a vacuum of 0.00133 Pa and then slowly cooled to prepare a bonded body (laminated radiation member). In this bonded body, the Cu—SiC radiation plate and the silicon nitride insulation substrate were bonded with a composite material layer of SiC/silver solder present between the radiation plate and the substrate, and the silicon nitride insulation substrate and the uppermost copper sheet 0.3 mm thick were bonded with a composite material layer of SiC/aluminum solder present between the substrate and the copper sheet.

Then, a resist for the formation of circuits was printed on the whole surface of the thus obtained laminated radiation member, then only the portions which were not etched later were selectively cured, then the uncured portions were removed, and the exposed copper was etched with an aqueous cupric chloride solution to form a circuit pattern of the uppermost copper sheet of the laminated radiation member. Furthermore, this was washed with an aqueous acid ammonium fluoride solution and additionally washed with water several times to remove the solder between the circuits.

Then, the resist was peeled off and finally the surface of the uppermost copper sheet (=circuit sheet) was subjected to Ni—P plating to form a protective layer, thereby obtaining a laminated radiation member.

EXAMPLE 8

Active Metal Method, Cu Casting

A silicon nitride insulation substrate of 50×40×0.3 mm having a thermal conductivity of 90 W/mK was prepared by adding $Y_2O_3$ and MgO as firing assistants to a commercially available silicon nitride powder and firing the mixture at a given temperature for a given period.

Figure 3:
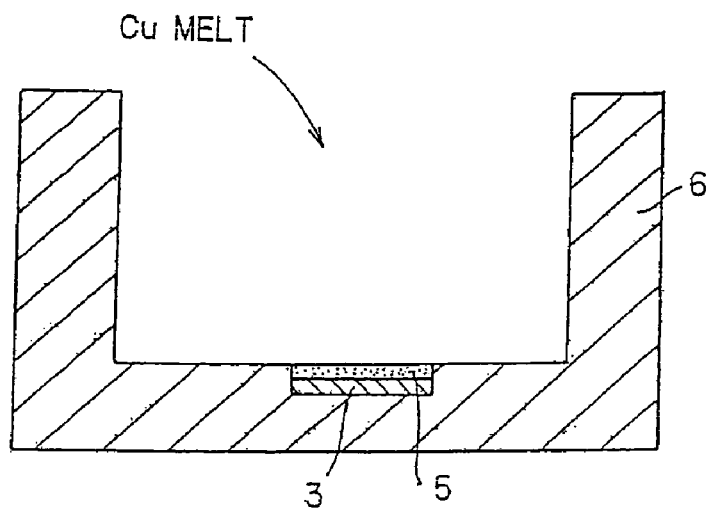
FIG. 3 is a sectional view of a mold used in the production of examples of the power semiconductor apparatus according to the present invention.
Figure 4:
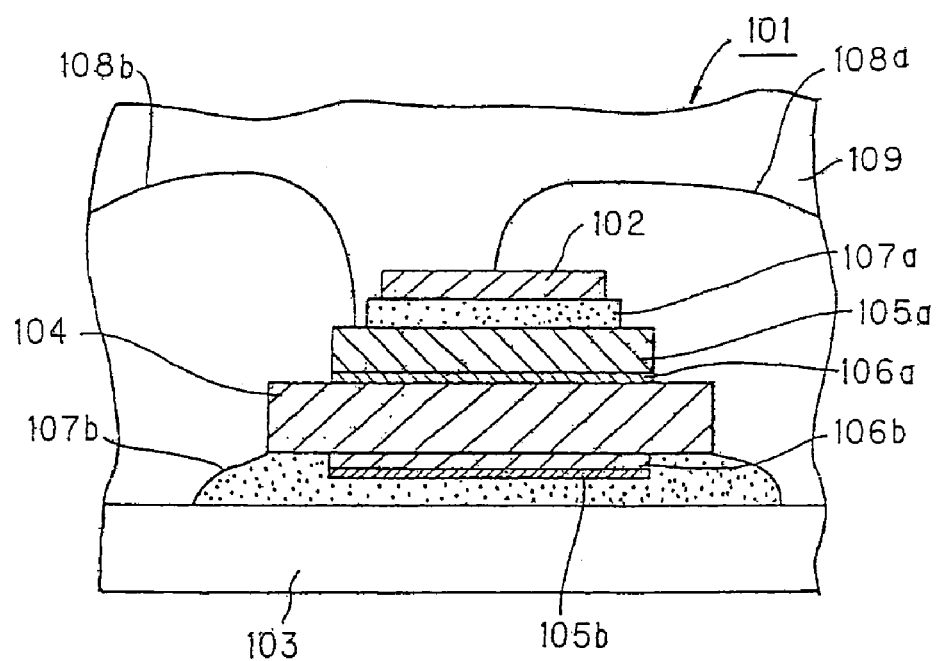
FIG. 4 is a sectional view showing the construction of the main part of a conventional power semiconductor apparatus.

Separately, pressure was applied to a mixture comprising commercially available SiC particles (average particle diameter: 50 μm) and commercially available Ti powder (average particle diameter: 44 µm) to reduce the thickness to improve packing rate of the particles, and this was placed on the upper surface of the above radiation plate. This was put in a mold as shown in FIG. 3 and heated to 1100° C., followed by casting a copper melt therein and cooling it to obtain a laminated radiation member.

In this laminated member, the copper radiation plate of about 80×50×3 mm and the silicon nitride insulation substrate were bonded with a composite material layer of SiC/copper present between the radiation plate and the substrate.

On the silicon nitride insulation substrate of the laminated radiation member was printed a commercially available Ag—Cu—Ti hard solder (Ag-35Cu-1.7Ti) paste at a given thickness, and thereon was placed a copper sheet 0.3 mm thick, followed by heat treating them in this state at 850° C. for 10 minutes in a vacuum of 0.00133 Pa to obtain a composite bonded member.

Then, a resist for the formation of circuits was printed on the whole surface of the thus obtained laminated radiation member, then only the portions which were not etched later were selectively cured, then the uncured portions were removed, and the exposed copper was etched with an aqueous cupric chloride solution to form a circuit pattern of the uppermost copper sheet of the laminated radiation member. Furthermore, this was washed with an aqueous acid ammonium fluoride solution and additionally washed with water several times to remove the solder material between the circuits.

Then, the resists were peeled off and finally the surface of the uppermost copper sheet (=circuit sheet) was subjected to Ni—P plating to form a protective layer, thereby making a laminated radiation member.

EXAMPLES 9 AND 10

Plating, Flame Spraying

A silicon nitride insulation substrate of 50×40×0.3 mm having a thermal conductivity of 90 W/mK was prepared by adding $Y_2O_3$ and MgO as firing assistants to a commercially available silicon nitride powder and firing the mixture at a given temperature for a given period. Separately, a Cu—SiC composite material (80×50×3 mm: radiation plate) having a thermal conductivity of 250 W/mK was prepared by the method disclosed in JP-A-11-029379.

Separately, surface of commercially available SiC particles (average particle diameter: 50 µm) was subjected to Ni—B plating at a thickness of about 0.5 µm by wet electroless plating. On the other hand, one side of the above silicon nitride insulation substrate was subjected to electroless Ni—B plating at a thickness of about 1 µm. Furthermore, one side of the above Cu—SiC composite material radiation plate was also subjected to electroless Ni—B plating at a thickness of about 1 µm. The above Ni—B plated SiC particles were disposed on the Ni—B plated surface of the radiation plate, followed by applying pressure to reduce the thickness to improve packing rate of the particles. On the upper surface thereof was placed a commercially available aluminum hard solder sheet (BA4004: Al-10Si-1.5Mg) and thereon was further placed the silicon nitride insulation substrate subjected to Ni—B plating on one side so that the Ni—B plated surface contacted the solder sheet.

Then, the resulting stack was kept at 700° C. for 3 minutes in a vacuum of 0.00133 Pa and then slowly cooled to prepare a bonded body (laminated radiation member). In this bonded body, the Cu—SiC radiation plate and the silicon nitride insulation substrate were bonded with a composite material layer of SiC/aluminum hard solder present between the radiation plate and the substrate.

Then, masking was carried out on the silicon nitride insulation substrate, followed by carrying out wet electroless copper plating at lower than 100° C. to form a copper circuit pattern. This was referred to as the sample of Example 9. Masking was carried out on the portions other than circuit pattern and an Al—Si layer of about 50 µm was flame sprayed, followed by carrying out HVOF flame spraying of Cu at a thickness of about 0.3 mm. After removing the masking, the surface of the copper circuit was made smooth by mechanical working to form a copper circuit. This was referred to as the sample of Example 10.

COMPARATIVE EXAMPLE 1

A silicon nitride insulation substrate of 50×40×0.3 mm having a thermal conductivity of 90 W/mK was prepared by adding $Y_2O_3$ and MgO as firing assistants to a silicon nitride powder and firing the mixture at a given temperature for a given period. Then, on both sides thereof was printed a commercially available Ag—Cu—Ti hard solder (Ag-35Cu-1.7Ti) paste at a given thickness, and on both sides thereof were placed copper sheets of 0.3 mm thick, followed by heat treating them in this state at 850° C. for 10 minutes in a vacuum of 0.00133 Pa to obtain a composite bonded body.

Then, a resist for the formation of circuits were printed on one side of the composite bonded body and was cured, then the copper was etched with an aqueous cupric chloride solution to form a circuit pattern. Furthermore, this was washed with an aqueous acid ammonium fluoride solution and additionally washed with water several times to remove the solder material between the circuits. Then, the surface of the metal portion was subjected to Ni—P plating to form a protective layer, thereby making a circuit substrate.

Then, the surface of the circuit substrate on which no circuits were formed and a Cu—SiC composite material made by the method disclosed in JP-A-11-029379 (80×50×3 mm: radiation plate) were bonded by soldering.

COMPARATIVE EXAMPLE 2

Radiation Plate/Hard Solder/Substrate/Hard Solder/Circuit

A silicon nitride insulation substrate of 50×40×0.3 mm having a thermal conductivity of 90 W/mK was prepared by adding $Y_2O_3$ and MgO as firing assistants to a commercially available silicon nitride powder and firing the mixture at a given temperature for a given period. Separately, a Cu—SiC composite material having a thermal conductivity of 250 W/mK was made by the method disclosed in JP-A-11-029379 (80×50×3 mm: radiation plate).

A commercially available Ag—Cu—Ti hard solder (Ag-35Cu-1.7Ti) paste was printed on the above radiation plate at a given thickness, and thereon was placed the above silicon nitride insulation substrate. Further, thereon was printed the commercially available Ag—Cu—Ti solder (Ag-35Cu-1.7Ti) paste at a given thickness and thereon was further placed a copper sheet 0.3 mm thick.

Then, this was kept at 850° C. for 10 minutes in a vacuum of 0.00133 Pa, followed by slow cooling to obtain a bonded body (laminated radiation member). In this bonded body, the Cu—SiC radiation plate and the silicon nitride insulation substrate were bonded with the Ag—Cu—Ti solder layer present therebetween, and the silicon nitride insulation substrate and the uppermost copper sheet 0.3 mm thick were also bonded with the Ag—Cu—Ti solder layer present therebetween.

Then, a resist for formation of circuits was printed on the whole surface of the thus obtained laminated radiation member, then only the portions which were not etched later were selectively cured, then the uncured portions were removed, and the exposed copper was etched with an aqueous cupric chloride solution to form a circuit pattern of the uppermost copper sheet of the laminated radiation member. Furthermore, this was washed with an aqueous acid ammonium fluoride solution and additionally washed with water several times to remove the solder material between the circuits.

Then, the resist was peeled off and finally the surface of the uppermost copper sheet (=circuit sheet) was subjected to Ni—P plating to form a protective layer, thereby making a laminated radiation member.

COMPARATIVE EXAMPLE 3

A sample was prepared in the same manner as in Comparative Example 2, except that a silicon nitride insulation substrate of 50×40×0.635 mm having a thermal conductivity of 180 W/mK was prepared by adding $Y_2O_3$ as a firing assistant to a commercially available aluminum nitride powder and firing the mixture at a given temperature for a given period.

The thus obtained samples were subjected to a thermal cycle characteristics test and a heat resistance test. The results are shown in Table 1. The results of the heat resistance test are shown by a relative value assuming the value obtained in Comparative Example 1 to be 1.0.

EXAMPLE 11

A commercially available IGBT element (power semiconductor) made of Si was bonded to the circuit electrode of the laminated radiation member made in Example 1 by low-temperature soldering. Then, a metal wire was electrically connected to the terminal of the IGBT element by wire bonding method and simultaneously a metal wire was also similarly connected to the circuit electrode. Thereafter, the laminated radiation member on which the IGBT element was mounted was put in a package. Then, a commercially available silicone gel for potting was poured into the above package and cured, followed by sealing the package to enhance the electrical insulation of the laminated radiation member on which the IGBT element was mounted and to increase the mechanical reliability, thereby obtaining a power semiconductor apparatus.

As mentioned above, the laminated radiation member and the power semiconductor apparatus according to the present invention show substantially no cracking caused by a difference in the thermal expansion coefficients of the insulation substrate, the metal base composite material and the radiation plate, because the radiation plate and the insulation substrate are bonded with a metal base composite material which is high in heat resistance and radiation properties. This includes a step of, if necessary, previously surface treating a bonding surface of the radiation plate and/or the insulation substrate to assure wettability with a solder material or a metal, a step of interposing ceramic particles

TABLE 1

| Example | Pre-treatment | Timing of bonding upper electrode | Radiation plate | Interface of Radiation plate & insulation substrate | Insulation substrate | Interface of insulation substrate & electrode | Circuit electrode | Thermal cycle characteristics | Thermal resistance (Standardized value) |
|---|---|---|---|---|---|---|---|---|---|
| 1 | Ni-plating | Simultaneously | Cu—SiC | SiC/Al hard solder | SN | SiC/Al hard solder | Cu | 3200 | 0.9 |
| 2 | Ni-plating | " | Cu | $Al_2O_3$/Al hard solder | SN | $Al_2O_3$/Al hard solder | Cu | 2600 | 0.7 |
| 3 | Powder active metal | " | Cu | AlN/Ag hard solder | SN | AlN/Ag hard solder | Cu | 3200 | 0.8 |
| 4 | Solid solution active metal | " | Cu | SiC/CuTi hard solder | SN | SiC/CuTi hard solder | Cu | 3000 | 0.8 |
| 5 | Ni-plating | " | Cu—SiC | SiC/Al hard solder | SN | SiC/Al hard solder | Cu | 1800 | 0.9 |
| 6 | Low-Temp. hard solder for electrode | Later | Cu—SiC | SiC/Ag hard solder | SN | Al hard solder | Cu | 2000 | 0.9 |
| 7 | Composite hard solder for electrode | " | Cu—SiC | SiC/Ag hard solder | SN | SiC/Al hard solder | Cu | 3200 | 0.8 |
| 8 | Casting of molten Cu | " | Cu | SiC/Cu composite material | SN | AgCuTi hard solder | Cu | 2600 | 0.7 |
| 9 | Plating | " | Cu | SiC/Al hard solder | SN | — | Cu | 1800 | 0.7 |
| 10 | Flame spraying | " | Cu—SiC | SiC/Al hard solder | SN | Al—Si | Cu | 2200 | 0.8 |
| Com. Exa. 1 | — | — | Cu—SiC | Solder + Cu + AgCuTi hard solder | SN | AgCuTi hard solder | Cu | 500 | 1.0 |
| 2 | — | — | Cu—SiC | AgCuTi hard solder | SN | AgCuTi hard solder | Cu | 100 | 0.8 |
| 3 | — | — | Cu—SiC | AgCuTi hard solder | SN | AgCuTi hard solder | Cu | 10 | 0.8 | previously surface treated to assure wettability with a solder material or a metal between the radiation plate and the insulation substrate, a step of disposing a solder material above and/or below the ceramic particles, a step of heating the solder material to a temperature higher than the melting point of the solder material to melt the solder material, a step of penetrating the molten solder material into spaces between the ceramic particles to react the ceramic particles with the solder material to produce the metal base composite material layer. Furthermore, according to the production method of the present invention as mentioned above, a laminated radiation member and a power semiconductor apparatus having the above properties can be obtained.

What is claimed is:

1. A power semiconductor apparatus comprising:
   a circuit electrode;
   a laminated radiation member comprising a radiation plate and an insulation substrate bonded to an upper surface of said radiation plate, said circuit electrode being provided on an upper surface of said insulation substrate;
   a semiconductor chip bonded to said circuit electrode; and
   a metal wire electrically connected to said semiconductor chip and a metal wire electrically connected to said circuit electrode;
   wherein said semiconductor chip, said laminated radiation member and said circuit electrode are sealed with an insulating sealer; and
   wherein said radiation plate and said insulation substrate are bonded via a metal-based composite material layer present between said radiation plate and said insulation substrate, said metal-based composite material layer comprising a metal-based material, surface treated ceramic particles having a metal surface layer dispersed within said metal-based material, particles of at least one active metal selected from the group consisting of Ti, Hf, Nb, Ta and Zr dispersed within said metal-based material, and a reaction product between said metal-based material and said metal surface layer of said surface treated ceramic particles, said reaction product comprising a metal element of said metal-based material and a metal element of said metal surface layer of said surface treated ceramic particles, wherein said active metal particles are added to said surface treated ceramic particles before said surface treated ceramic particles are dispersed within said metal-based material, and wherein a pressure is applied to said surface treated ceramic particles to reduce the thickness and improve the packing rate of said surface treated ceramic particles before said surface treated ceramic particles are dispersed within said metal-based material.

2. A power semiconductor apparatus comprising:
   a circuit electrode;
   a laminated radiation member comprising a radiation plate and an insulation substrate bonded to an upper surface of said radiation plate, said circuit electrode being provided on an upper surface of said insulation substrate;
   a semiconductor chip bonded to said circuit electrode; and
   a metal wire electrically connected to said semiconductor chip and a metal wire electrically connected to said circuit electrode;
   wherein said semiconductor chip, said laminated radiation member and said circuit electrode are sealed with an insulating sealer; and
   wherein said radiation plate and said insulation substrate are bonded via a metal-based composite material layer present between said radiation plate and said insulation substrate, said metal-based composite material layer comprising a metal-based material, surface treated ceramic particles having a metal surface layer and having an average particle diameter in a range of 10–50 µm dispersed within said metal-based material, particles of at least one active metal selected from the group consisting of Ti, Hf, Nb, Ta and Zr dispersed within said metal-based material, and a reaction product between said metal-based material and said metal surface layer of said surface treated ceramic particles, said reaction product comprising a metal element of said metal-based material and a metal element of said metal surface layer of said surface treated ceramic particles, wherein said active metal particles are added to said surface treated ceramic particles before said surface treated ceramic particles are dispersed within said metal-based material, and wherein a pressure is applied to said surface treated ceramic particles to reduce the thickness and improve the packing rate of said surface treated ceramic particles before said surface treated ceramic particles are dispersed within said metal-based material.

* * * * *